United States Patent [19]
Lyons

[11] Patent Number: 6,156,480
[45] Date of Patent: Dec. 5, 2000

[54] LOW DEFECT THIN RESIST PROCESSING FOR DEEP SUBMICRON LITHOGRAPHY

[75] Inventor: Christopher F. Lyons, Fremont, Calif.

[73] Assignee: Advanced Micro Devices, Inc., Sunnyvale, Calif.

[21] Appl. No.: 09/336,455

[22] Filed: Jun. 18, 1999

[51] Int. Cl.$^7$ ...................................................... G03F 7/004
[52] U.S. Cl. ........................................ 430/270.1; 430/312
[58] Field of Search ................................ 430/270.1, 312; 216/47

[56] References Cited

U.S. PATENT DOCUMENTS

| | | | |
|---|---|---|---|
| 5,273,856 | 12/1993 | Lyons et al. ............................ | 430/191 |
| 5,723,258 | 3/1998 | Kim et al. ............................ | 430/270.1 |
| 5,892,096 | 4/1999 | Meador et al. ......................... | 558/393 |
| 6,020,269 | 1/2000 | Wang et al. ............................ | 438/717 |

OTHER PUBLICATIONS

"Ultrathin Photoresists for EUV lithography", Rao, V. et al, SPIE, vol. 3676, pt.2, 1999, 615–626.

Moreau et al., "Speed Ehancement of PMMA Resist", J. Vac. Sci. Technol., Vol. No. 16, No. 6 (Nov./Dec. 1979) pp. 1989–1991.

Havard et al., "Design of a Positive Tone Water–Soluble Resist", Department of Chemistry and Chemical Engineering, University of Texas, SPIE vol. 3049, pp. 437–447.

Miles et al., "New Thermally Crosslikable Electron–Beam Resists: 1. Itaconic Anhydride–Methyl Methacrylate Copolymers", Polymer, 91, vol. 32, No. 3, (1991) pp. 484–488.

*Primary Examiner*—Janet Baxter
*Assistant Examiner*—Rosemary Ashton
*Attorney, Agent, or Firm*—Renner, Otto, Boisselle, & Sklar, LLP

[57] ABSTRACT

In one embodiment, the present invention relates to a method of forming a short wavelength thin photoresist coating having a low defect density by depositing sequentially at least two discrete ultra-thin photoresist layers to form the short wavelength thin photoresist coating, each ultra-thin photoresist layer independently having a thickness from about from about 200 Å to about 2,500 Å, the short wavelength thin photoresist coating, having a thickness of about 5,000 Å or less.

20 Claims, 1 Drawing Sheet

LOW DEFECT THIN RESIST PROCESSING FOR DEEP SUBMICRON LITHOGRAPHY

TECHNICAL FIELD

The present invention generally relates to improved lithography methods. In particular, the present invention relates to using multiple layers of ultra-thin photoresists to form a thin photoresist coating having a low defect density.

BACKGROUND ART

In the semiconductor industry, there is a continuing trend toward higher device densities. To achieve these high densities there has been and continues to be efforts toward scaling down the device dimensions on semiconductor wafers. In order to accomplish such high device packing density, smaller and smaller features sizes are required. This includes the width and spacing of interconnecting lines, gate conductors, trenches, vias and various other devices and features that are formed with the aid of lithography. Since numerous devices, interconnecting lines and other features are typically present on a semiconductor wafer, the trend toward higher device densities is a notable concern.

The requirement of small features (and close spacing between adjacent features) requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, X-rays, or an electron beam) illuminates selected areas of the surface through an intervening master template, the photomask, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Exposure of the coating through the photomask causes a chemical transformation in the exposed areas of the coating thereby making the image area either more or less soluble (depending on the coating) in a particular solvent developer. The more soluble areas are removed in the developing process to leave the pattern image in the coating as less soluble polymer.

Projection lithography is a powerful and essential tool for microelectronics processing. Using light having smaller wavelengths to selectively expose photoresists prior to development increases the resultant resolution. This is because precise control over the exposure area is increased as the wavelength of light decreases. As a result, there is trend toward the use of photoresists that are patterned using light having a relatively short wavelength. However, there are several concerns associated with using shorter wavelengths of light. As the wavelength of light decreases, the penetration depth of that light into a given photoresist generally decreases. This is a problem when most photoresists are coated on a semiconductor substrate at a thickness between 10,000 Å and 20,000 Å.

Simply applying a thinner coating of a photoresist does not enable adequate and/or reliable use of the photoresist. This is because coated photoresists typically contain pinhole defects. Pinhole defects inhibit crisp pattern formation and critical dimensional control in developed photoresists. When a photoresist has a thickness of 10,000 Å or higher, pinhole defects are not a concern since the pinholes are relatively small in relation to the photoresist thickness. As the thickness of a photoresist decreases, the deleterious effects, of pinhole defects increases. This is shown in FIG. 1. FIG. 1 illustrates a substrate 10 with a thin photoresist 12 having a thickness of about 5,000 Å. The thin photoresist 12 has a number of relatively large pinholes 14; that is, relatively large compared to the photoresist thickness. Minimizing the deleterious effects of pinhole defects or the occurrence of pinhole defects in relatively thin photoresists is therefore desired.

SUMMARY OF THE INVENTION

The present invention provides methods of forming small features, in some instances on the sub-micron scale. The present invention specifically provides methods of making thin photoresist coatings with very low defect densities by depositing multiple layers of ultra-thin photoresists. As a result, the present invention effectively addresses the concerns raised by the trend towards the miniaturization of semiconductor devices.

In one embodiment, the present invention relates to a method of forming a short wavelength thin photoresist coating having a low defect density by depositing sequentially at least two discrete ultra-thin photoresist layers to form the short wavelength thin photoresist coating, each ultra-thin photoresist layer independently having a thickness from about from about 200 Å to about 2,500 Å, the short wavelength thin photoresist coating having a thickness of about 5,000 Å or less.

In another embodiment, the present invention relates to a method of forming a short wavelength thin photoresist coating having a low defect density by depositing sequentially at least three discrete ultra-thin photoresist layers to form the short wavelength thin photoresist coating, each ultra-thin photoresist layer independently having a thickness from about 250 Å to about 2,000 Å and comprising a pre-crosslinked photoresist material, the short wavelength thin photoresist coating having a thickness of about 5,000 Å or less.

In yet another embodiment, the present invention relates to a method of decreasing pinhole size in a thin photoresist coating by forming the thin photoresist coating by sequentially depositing at least two discrete layers of an ultra-thin photoresist, each ultra-thin photoresist layer independently having a thickness from about from about 300 Å to about 1,500 Å, the thin photoresist coating having a thickness from about from about 600 Å to about 4,500 Å, the thin photoresist coating having smaller pinholes than a photoresist of the same thickness formed by depositing one layer of a photoresist material.

DISCLOSURE OF INVENTION

Figure 1:
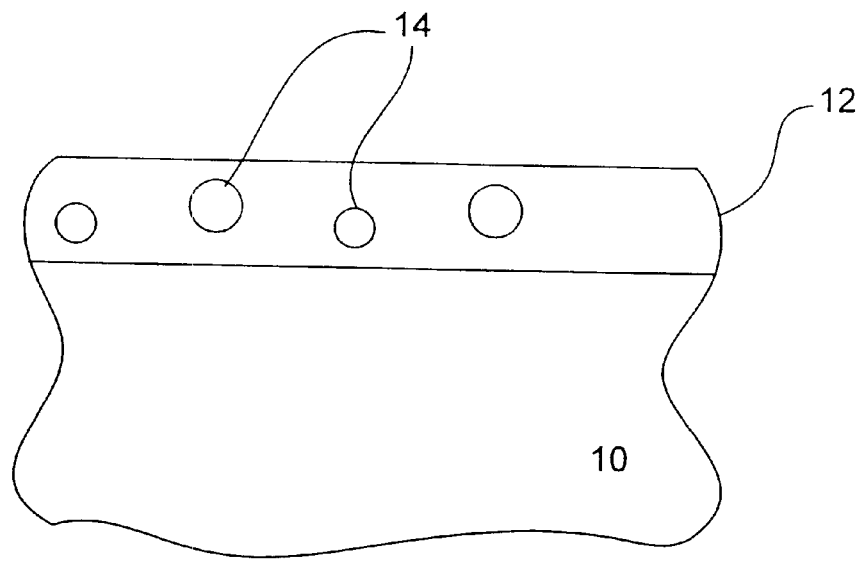
FIG. 1 illustrates, in a cross-sectional view, pinholes in a conventional thin photoresist.

The present invention involves making thin photoresists with low defect density. The present invention more specifically involves using multiple layers of ultra-thin photoresists to form a thin photoresist coating having a low defect density. The size of any pinholes is limited by the thickness of a given photoresist layer. By depositing multiple, discrete layers of ultra-thin photoresist layers, the size of pinholes, if any, is thus limited by the thickness of the individual ultra-thin photoresist layers. And pinholes in the individual ultra-thin photoresist layers have an extremely low probability of being positioned directly over one another. Forming thin photoresists with low defect densities facilitates the use of short wavelength photolithography. Expanding the use of short wavelength photolithography, in turn, increases the resolution of photoresist patterns further enabling miniturization and device scaling.

The thin photoresist, comprised of multiple layers of ultra-thin photoresist layers, is formed over a substrate. The substrate is typically a silicon substrate with or without various devices, elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc. The thin photoresist is provided over a portion of the substrate or over the entire substrate.

The thin photoresist has a thickness of about 5,000 Å or less. In another embodiment, the thin photoresist has a thickness of about 3,500 Å or less. In yet another embodiment, the thin photoresist has a thickness of about 2,000 Å or less. In still yet another embodiment, the thin photoresist has a thickness of about 1,500 Å or less.

The thin photoresist is deposited by multiple depositions of ultra-thin photoresist layers using conventional spin-coating or spin casting techniques. The thin photoresist contains at least two layers of an ultra-thin photoresist. In another embodiment, the thin photoresist contains at least three layers of an ultra-thin photoresist. In yet another embodiment, the thin photoresist contains at least four layers of an ultra-thin photoresist. In still yet another embodiment, the thin photoresist contains at least five layers of an ultra-thin photoresist. Although there is no upper limit to the number of ultra-thin photoresist layers, typically the thin photoresist contains from 2 to about 20, and more typically from 3 to about 10 layers of an ultra-thin photoresist.

The multiple ultra-thin photoresist layers that comprise the thin photoresist coating may have the same thickness, substantially the same thickness, or different thicknesses. In a preferred embodiment, the multiple ultra-thin photoresist layers of the thin photoresist coating have the same thickness or substantially the same thickness. Each ultra-thin photoresist layer has a thickness from about 200 Å to about 2,500 Å. In another embodiment, each ultra-thin photoresist layer has a thickness from about 250 Å to about 2,000 Å. In yet another embodiment, each ultra-thin photoresist layer has a thickness from about 300 Å to about 1,500 Å. In still yet another embodiment, each ultra-thin photoresist layer has a thickness from about 400 Å to about 1,000 Å.

The multiple ultra-thin photoresist layers are deposited in such a manner that intermixing or redissolving between layers is minimized or preferably prevented. In other words, intermixing or redissolving is minimized or prevented when an ultra-thin photoresist layer is deposited on an underlying, previously deposited ultra-thin photoresist layer. The solubility of adjacent ultra-thin photoresist layers is extremely low. Depositing photoresist layers in this manner is termed depositing "discrete" ultra-thin photoresist layers. This can be accomplished in at least two ways.

In one embodiment, a pre-crosslinked or partially cured photoresist is deposited to form each ultra-thin photoresist layer. Pre-crosslinking in the photoresists is typically accomplished via acetal linkages, condensation reactions, such as anhydride and amide formation, and similar reactions. Acetal linkages are, in turn, accomplished by crosslinking at least a portion of the acetal groups of a polymer. See, for example, U.S. Pat. No. 5,723,258 which describes incorporating acetal groups into photoresist polymer systems and is incorporated by reference for its teachings in this regard. Incorporation of anhydride groups into photoresist polymer systems is described in Moreau et al., J. Vac. Sci. Technol., Vol. 16, No. 6, November/December 1979, which is hereby incorporated by reference for its teachings in this regard.

Pre-crosslinking or partial curing may be induced by heat and/or irradiation. The temperature to which the ultra-thin photoresist material is heated and/or the particular wavelength employed to induce partial curing depends upon the chemical constitution of the photoresist material, and suitable temperatures and wavelengths can be determined by those skilled in the art. Partial curing, however, does not prevent or degrade subsequent development of the thin photoresist.

In this embodiment, the photoresist material is contained in a solvent, which is deposited on the substrate or on another ultra-thin photoresist layer. Prior to depositing a subsequent ultra-thin photoresist layer, the solvent is permitted and/or induced to evaporate. The time required for the solvent to evaporate primarily depends upon the identity of the solvent and the amount of solvent employed. In one embodiment, the time between depositions of the individual ultra-thin photoresist layers is at least about 5 seconds, and typically from about 5 seconds to about 5 minutes. In another embodiment, the time between depositions of the individual ultra-thin photoresist layers is at least about 10 seconds, and from about 10 seconds to about 2 minutes.

In another embodiment, partial curing is effected after each ultra-thin photoresist layer is deposited. Again, partial curing may be induced by heat and/or irradiation. Also in this embodiment, the temperature to which the ultra-thin photoresist layer is heated and/or the particular wavelength employed to induce partial curing depends upon the chemical constitution of the photoresist material, and suitable temperatures and wavelengths can be determined by one skilled in the art. Partial curing, however, does not prevent or degrade subsequent development of the thin photoresist. One example of partial curing is so-called B-staging.

In this embodiment, the time between depositions of the individual ultra-thin photoresist layers is longer than the embodiment where a pre-crosslinked photoresist material is employed. In one embodiment, the time between depositions of the individual ultra-thin photoresist layers is at least about 15 seconds, and typically from about 30 seconds to about 10 minutes. In another embodiment, the time between depositions of the individual ultrathin photoresist layers is at least about 30 seconds, and from about 30 seconds to about 5 minutes.

Thin resists may be processed using small wavelength radiation, such as deep UV and extreme UV radiation. As used herein, small wavelength radiation means electromagnetic radiation having a wavelength of about 250 nm or less. In one embodiment, small wavelength radiation includes electromagnetic radiation having a wavelength of about 200 mm or less. In another embodiment, small wavelength radiation includes extreme UV electromagnetic radiation having a wavelength of about 25 nm or less. In yet another embodiment, small wavelength radiation includes extreme UV electromagnetic radiation having a wavelength of about 15 nm or less.

Small wavelength radiation increases precision and thus the ability to improve critical dimension control and resolution. Specific examples of wavelengths to which the thin photoresists are sensitive (undergo chemical transformation enabling subsequent development) include about 248 nm, about 193 nm, about 157 nm, about 13 nm, about 11 nm and about 1 nm. Specific sources of radiation include KrF excimer lasers having a wavelength of about 248 nm, a XeHg vapor lamp having a wavelength from about 200 nm to about 250 nm, mercury-xenon arc lamps having a wavelength of about 248 nm, an ArF excimer laser having a wavelength of about 193 nm, an $F_2$ excimer laser having a wavelength of about 157 nm, extreme UV light having wavelengths of about 13.4 nm and about 11.5 nm, and X-rays having a wavelength of about 1 nm.

The thin photoresist coating is suitable for functioning as a mask for etching underlying layers and/or selectively depositing films wherein the patterns or openings formed in the subsequently developed thin photoresist layer are less than about 0.25 $\mu$m, about 0.18 $\mu$m or less, about 0.15 $\mu$m or less, about 0.13 $\mu$m or less, about 0.1 $\mu$m or less, about 0.075 $\mu$m or less, and even 0.05 $\mu$m or less. Since the thin photoresist layers are relatively thin compared with I-line and other photoresists, improved critical dimension control is realized.

In embodiments where the patterns or openings formed in the developed thin photoresist layer are from about 0.15 $\mu$m to about less than 0.25 $\mu$m, a 248 $\mu$m sensitive photoresist or a 193 nm sensitive photoresist is preferably employed. In embodiments where the patterns or openings formed in the developed thin photoresist layer are from about 0.1 $\mu$m to about 0.15 $\mu$m, a 157 nm sensitive photoresist or a 193 nm sensitive photoresist is preferably employed. In embodiments where the patterns or openings formed in the developed thin photoresist layer are about 0.1 $\mu$m or less, a 13 nm sensitive photoresist or an 11 nm sensitive photoresist (extreme UV photoresist) is preferably employed.

Positive or negative thin photoresists may be employed in the methods of the present invention. An example of a deep UV chemically amplified photoresist is a partially t-butoxycarbonyloxy substituted poly-p-hydroxystyrene. Photoresists are commercially available from a number of sources, including Shipley Company, Kodak, Hoechst Celanese Corporation, and Brewer.

Figure 2:
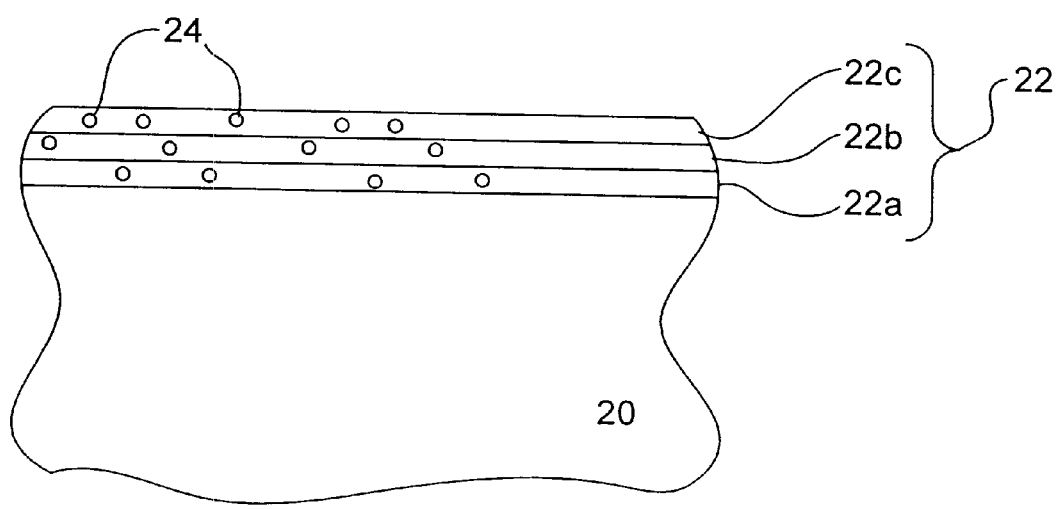
FIG. 2 illustrates, in a cross-sectional view, a thin photoresist made according to several aspects of the present invention.

Referring to FIG. 2, the present invention is illustrated. A substrate 20 is provided, which may or may not have any number of layers, devices and/or elements (not shown) thereon. A thin photoresist 22 having a thickness of about 5,000 Å or less (about 5,000 Å in this embodiment) is formed on the substrate 20 by depositing multiple, discrete layers of an ultra-thin photoresist 22a, 22b, and 22c. Although not always present, pinholes 24 have a relatively small size compared to the pinholes 14 in the thin photoresist 12 of the prior art, as shown in FIG. 1.

After all of the ultra-thin photoresist layers are deposited to form the thin photoresist coating, thin photoresist coating is exposed to radiation and developed to provide a patterned photoresist. Either the exposed or unexposed portions of the thin photoresist layer are removed or developed to provide the patterned photoresist. The patterned photoresist is then used as a mask to either selectively etch portions of the underlying substrate or selectively deposit a material on the exposed portions of the underlying substrate. The patterned photoresist is then stripped using a suitable stripper.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a short wavelength thin photoresist coating having a low defect density, comprising:

depositing sequentially at least two discrete ultra-thin photoresist layers to form the short wavelength thin photoresist coating, each ultra-thin photoresist layer independently having a thickness from about from about 200 Å to about 2,500 Å, the short wavelength thin photoresist coating having a thickness of about 5,000 Å or less.

2. The method of claim 1, wherein at least three discrete ultra-thin photoresist layers are deposited to form the short wavelength thin photoresist coating.

3. The method of claim 1, wherein at least five discrete ultra-thin photoresist layers are deposited to form the short wavelength thin photoresist coating.

4. The method of claim 1, wherein the ultra-thin photoresist layers comprise a pre-crosslinked material.

5. The method of claim 4, wherein the pre-crosslinked material of the ultra-thin photoresist layers comprises a polymer with at least one of acetal groups and anhydride groups.

6. The method of claim 1, wherein each ultra-thin photoresist layer is partially cured prior to deposition of a subsequent ultra-thin photoresist layer.

7. The method of claim 1, wherein the short wavelength thin photoresist coating comprises a photoresist material sensitive to a wavelength of about 250 nm or less.

8. A method of forming a short wavelength thin photoresist coating having a low density, comprising:

depositing sequentially at least three discrete ultra-thin photoresist layers to form the short wavelength thin photoresist coating, each ultra-thin photoresist layer independently having a thickness from about 250 Å to about 2,000 Å and comprising a pre-crosslinked photoresist material, the short wavelength thin photoresist coating having a thickness of about 5,000 Å or less.

9. The method of claim 8, wherein the pre-crosslinked photoresist material of the ultra-thin photoresist layers comprises a polymer with at least one of acetal groups and anhydride groups.

10. The method of claim 8, wherein the pre-crosslinked photoresist material of the ultra-thin photoresist layers is pre-crosslinked by at least one of thermal crosslinking and photo crosslinking.

11. The method of claim 8, wherein the short wavelength thin photoresist coating comprises a photoresist material sensitive to a wavelength of about 200 nm or less.

12. The method of claim 8, wherein the short wavelength thin photoresist coating comprises a photoresist material sensitive to a wavelength of about 25 nm or less.

13. The method of claim 8, wherein the time between depositions of the discrete ultra-thin photoresist layers is from about 5 seconds to about 5 minutes.

14. The method of claim 8, wherein the short wavelength thin photoresist coating has a thickness of about 3,500 Å or less.

15. A method of decreasing pinhole size in a thin photoresist coating, comprising:
   forming the thin photoresist coating by sequentially depositing at least two discrete layers of an ultra-thin photoresist, each ultra-thin photoresist layer independently having a thickness from about from about 300 Å to about 1,500 Å, the thin photoresist coating having a thickness from about from about 600 Å to about 4,500 Å, the thin photoresist coating having smaller pinholes than a photoresist of the same thickness formed by depositing one layer of a photoresist material.

16. The method of claim 15, wherein the thin photoresist coating comprises a photoresist material sensitive to a wavelength of about 200 nm or less.

17. The method of claim 15, wherein each ultra-thin photoresist layer comprises a pre-crosslinked material.

18. The method of claim 15, wherein each ultra-thin photoresist layer is partially cured prior to deposition of a subsequent ultra-thin photoresist layer.

19. The method of claim 18, wherein each ultra-thin photoresist layer is partially cured by at least one of thermal crosslinking and photo crosslinking.

20. The method of claim 15, wherein from 2 to about 20 discrete layers of an ultra-thin photoresist are deposited to form the thin photoresist coating.

* * * * *

UNITED STATES PATENT AND TRADEMARK OFFICE
CERTIFICATE OF CORRECTION

PATENT NO. : 6,156,480  
DATED : December 5, 2000  
INVENTOR(S) : Christopher F. Lyons Page 1 of 1

It is certified that error appears in the above-identified patent and that said Letters Patent is hereby corrected as shown below:

<u>Column 5,</u>
Line 65, replace "tc" with -- to --.

<u>Column 6,</u>
Line 46, replace "low density" with -- low defect density --.

Signed and Sealed this

Second Day of October, 2001

*Attest:*

*Nicholas P. Godici*

*Attesting Officer*

NICHOLAS P. GODICI
*Acting Director of the United States Patent and Trademark Office*